United States Patent
Yokouchi et al.

(10) Patent No.: US 6,900,475 B2
(45) Date of Patent: May 31, 2005

(54) SURFACE-EMISSION SEMICONDUCTOR LASER DEVICE

(75) Inventors: Noriyuki Yokouchi, Chiyoda-ku (JP); Norihiro Iwai, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/246,533

(22) Filed: Sep. 19, 2002

(65) Prior Publication Data

US 2003/0022410 A1 Jan. 30, 2003

Related U.S. Application Data

(63) Continuation of application No. 09/546,691, filed on Apr. 10, 2000, now abandoned.

(30) Foreign Application Priority Data

Apr. 23, 1999 (JP) .......................................... 11-115964

(51) Int. Cl.$^7$ ............................................. H01L 33/00
(52) U.S. Cl. ........................... 257/99; 257/91; 257/448; 257/766
(58) Field of Search ............................. 438/22, 26, 36, 438/67, 46, 47, 37; 257/79–103, 448, 766

(56) References Cited

U.S. PATENT DOCUMENTS

| | | | |
|---|---|---|---|
| 3,386,867 A | 6/1968 | Staples | |
| 3,959,522 A | 5/1976 | Ladany et al. | |
| 4,179,534 A | 12/1979 | Chang et al. | |
| 4,766,472 A | * 8/1988 | Brillouet et al. | ............... 357/19 |
| 4,853,346 A | 8/1989 | Baker et al. | |
| 5,731,224 A | 3/1998 | Gerner | |
| 5,896,408 A | 4/1999 | Corzine et al. | |
| 5,959,401 A | 9/1999 | Asami et al. | |
| 6,014,400 A | * 1/2000 | Kobayashi | ................... 372/96 |
| 6,061,380 A | 5/2000 | Jiang et al. | |
| 6,061,485 A | 5/2000 | Jiang et al. | |
| 6,316,792 B1 | 11/2001 | Okazaki et al. | |
| 6,420,736 B1 | 7/2002 | Chen et al. | |

FOREIGN PATENT DOCUMENTS

JP          5-231446          9/1993

OTHER PUBLICATIONS

Electron microscope studies in an alloyed Au/Ni/Au–Ge ohmic contact to GaAs, T.S. Kuan et al, J. Appl. Phys. 54 (12), Dec. 1983, 1983 American Institute of Physics, pps. 6952–6957.

Structural analysis of Au–Ni–Ge and Au–Ag–Ge alloyed ohmic contacts on modulation–doped AlGaAs–GaAs heterostructures, T.K. Higman et al, J. Appl. Physics. 60(2), Jul. 15, 1986, 1986 American Institute of Physics, pps 677–680.

A Surface–Emitting Laser Array with Backside Guiding Holes for Passive Alignment to Parallel Optical Fibers, K. Matsuda et al, IEEE Photonics Technology Letters, vol. 8, No. 4, Apr. 1996, pp. 494–496.

(Continued)

*Primary Examiner*—Long Pham
*Assistant Examiner*—Wai-Sing Louie
(74) *Attorney, Agent, or Firm*—Oblon, Spivak, McClelland, Maier & Neustadt, P.C.

(57) ABSTRACT

A method for fabricating a surface-emission semiconductor laser on a p-type substrate includes the step of interposing an Au film between an AuGeNi film or AuGe film of an n-side electrode and a compound semiconductor layer of an n-type DBR, followed by annealing to form an Au alloy in the n-side electrode. The presence of the Au alloy film improves the adherence between the n-side electrode and the compound semiconductor layer to improve an injection current vs. applied voltage characteristic.

4 Claims, 3 Drawing Sheets

OTHER PUBLICATIONS

Effects of Interfacial microstructure on uniformity and thermal stability of AuNiGe ohmic contact to n-type GaAs, Yih–Chen Shih et al, J. Appl. Phys. 62 (2), Jul. 15, 1987, 1987 American Institute of Physics, pps 582–590.

Vishnyakov et al., Production of Ohmic Contacts to AlGaAs of the n– and p–type Conductivity with Surface Cleaning in Atomic Hydrogen, SPIE Conference on Microelectronic Devices, Santa Clara, Sep. 1998, pp. 335–340.

* cited by examiner

SURFACE-EMISSION SEMICONDUCTOR LASER DEVICE

This application is a Continuation of application Ser. No. 09/546,691 filed on Apr. 10, 2000, now abandoned.

BACKGROUND OF THE INVENTION (a) Field of the Invention

The present invention relates to a method for fabricating a surface-emission semiconductor laser device and, more particularly, to a method for fabricating a surface-emission semiconductor laser device which has an improved characteristic of injected current/applied voltage and thus is suited for use in an optical data transmission or optical communication.

(b) Description of a Related Art

Surface-emission semiconductor laser devices, particularly those implemented on GaAs substrates, attract a large attention as light sources for use in optical communication systems in the field of data communication. The surface-emission semiconductor laser device fabricated on a GaAs substrate generally includes a pair of multi-layered semiconductor mirrors, or distributed Bragg reflectors (DBRs), each formed of a plurality of pairs of AlGaAs layers each having a mixed crystal structure, and a GaAs active layer structure sandwiched between the pair of DBRs for emission of laser perpendicular to the main surface of the GaAs substrate.

The surface-emission semiconductor laser device, which emits laser perpendicular to the main surface of a substrate, has an advantage of integration feasibility wherein a large number of laser elements are arranged two-dimensionally on the single substrate. Accordingly, the surface-emission semiconductor laser devices are particularly suitable for applications to parallel optical information processing, such as optical interconnection and optical computing, or a large-scale parallel optical transmission by taking advantage of the parallel optical beams.

The surface-emission semiconductor laser device implemented on an n-type GaAs substrate includes a p-type DBR, which has a larger resistivity compared to the n-type DBR due to the inherent characteristic thereof and a smaller occupied area compared to the n-type DBR due to the device structure. This raises a problem of higher electric resistance of the p-type DBR, which causes a smaller injected current with respect to a voltage applied between the electrodes.

Patent Publication No. 2697455, for example, proposes a surface-emission semiconductor laser device for solving the above problem by incorporating a p-type substrate, which mounts thereon an n-type DBR and an active layer which have a column structure and a p-type DBR formed on the substantially entire surface of the p-type substrate to have a lower electric resistance.

FIG. 1 shows the surface-emission semiconductor laser device described in the above-mentioned publication. The semiconductor laser device 50 includes a p-type GaAs substrate 52, a p-type DBR 54 composed of GaAs/AlAs layers formed on the entire surface of the p-type substrate 52, a column structure formed thereon and including an active layer structure 56, an n-type DBR 58 composed of GaAs/AlAs layers and an n-side electrode 60, and a p-side electrode 62 formed on the p-type DBR 54 separately from the column structure. The laser device 50 emits laser perpendicularly to and through the bottom surface of the substrate 52, as shown in FIG. 1.

In a laser device formed on a p-type substrate, in general, an n-type compound semiconductor layer constitutes the top of the epitaxial layers. In the example of FIG. 1, the top epitaxial layer is the n-type GaAs layer or the AlAs layer implementing the n-type DBR 58.

Since the surface-emission semiconductor laser device generally includes epitaxial layers having complicated structures formed on a small area of the main surface of the substrate, the contact area between the n-type compound semiconductor layer and the n-side electrode is inherently small. This highlights the importance in reduction of the contact resistance between the n-type compound semiconductor layer and the n-side electrode in the surface-emission semiconductor laser device. In a conventional surface-emission semiconductor laser having the p-type substrate, however, the reduction of the contact resistance is not satisfactory, and thus the operational voltage of the surface-emission semiconductor laser device is higher than the desired voltage.

SUMMARY OF THE INVENTION

In view of the above, it is an object of the present invention to provide a method for fabricating a surface-emission semiconductor laser device on a p-type substrate, the surface-emission semiconductor laser device having a smaller contact resistance between the n-type compound semiconductor layer and the n-side electrode.

The present invention provides a method for fabricating a surface-emission semiconductor laser device, including the steps of forming consecutively a p-type distributed Bragg reflector (DBR), an active layer structure for emitting laser, and an n-type DBR which overlie a main surface of a p-type semiconductor substrate, forming an n-side electrode overlying the n-type DBR, and forming a p-side electrode on a bottom surface of the p-type semiconductor substrate, the n-side electrode forming step including the steps of forming an Au film, forming an AuGeNi film or AuGe film on the Au film, and forming an alloy between the Au film and the AuGeNi film or AuGe film.

In accordance with the method of the present invention, the presence of the Au film improves the adherence between the compound semiconductor layer and the n-side electrode, which in turn improves an injection current vs. applied voltage characteristic.

The above and other objects, features and advantages of the present invention will be more apparent from the following description, referring to the accompanying drawings.

PREFERRED EMBODIMENTS OF THE INVENTION

Before describing an embodiment of the present invention, the principle or the concept of the present invention will be described.

In a typical surface-emission semiconductor laser device of the prior art having a p-type substrate, the n-side electrode is generally made of AuGe or AuGeNi formed on the n-type compound semiconductor layers epitaxially grown on the p-type substrate (refer to, for example, K. Matusda, et al., IEEE Photonics Technol. Lett., vol. 8, pp.494, 1996).

The inventors noticed the excellent adherence between a compound semiconductor layer and an Au film, and had an idea of interposing an Au film between the n-type compound semiconductor layers and the n-side electrode made of AuGe(Ni) for reduction of the contact resistance therebetween. The inventors fabricated a number of samples of surface-emission semiconductor lasers on p-type GaAs substrates, the semiconductor lasers having a variety of n-side electrodes made of metallic or alloy films. The inventors then conducted experiments thereto by measuring injected current vs. applied voltage characteristics.

Figure 1:
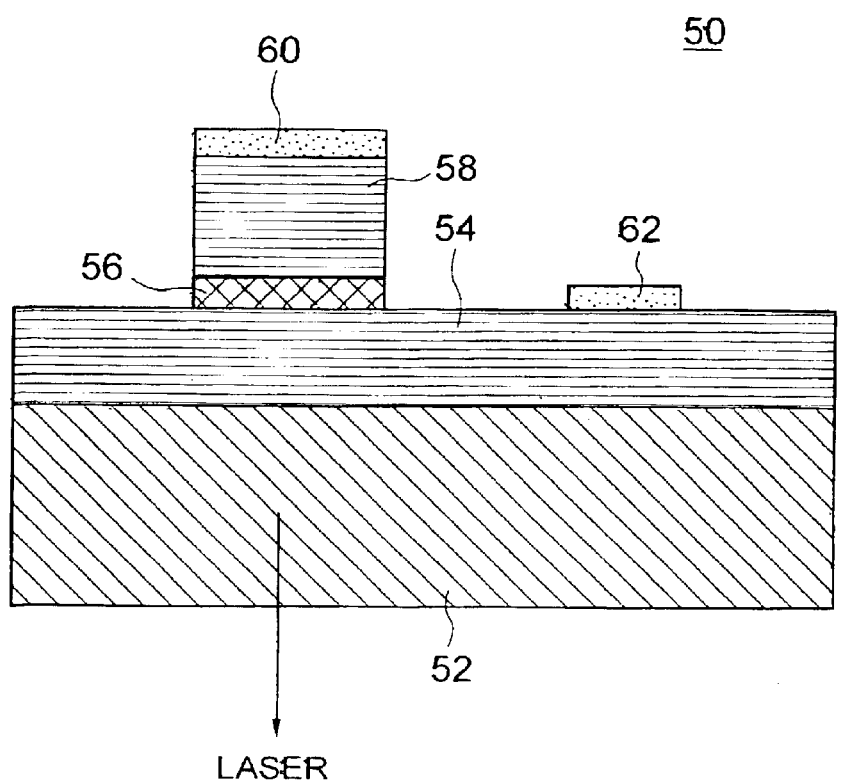
FIG. 1 is a sectional view of a conventional surface-emission semiconductor laser device.
Figure 2A:
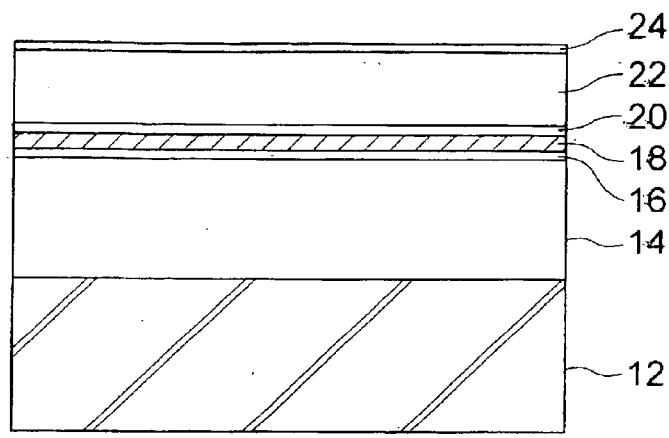
FIGS. 2A to 2D are sectional views of a surface-emission semiconductor laser device in consecutive steps of fabrication thereof in a method according to an embodiment of the present invention.

Experiments:

The samples were fabricated by using the method shown in FIGS. 2A to 2D. In FIG. 2A, 28 combinations of a p-type $Al_{0.2}Ga_{0.8}As$ layer and a p-type $Al_{0.9}Ga_{0.1}As$ layer and an additional p-type $Al_{0.9}Ga_{0.1}As$ layer were epitaxially grown on a p-type GaAs substrate 12 by using a MOCVD (metal-organic chemical vapor deposition) technique to form a p-type DBR 14.

Subsequently, an undoped lower $Al_{0.3}Ga_{0.7}As$ cladding layer 16, an active layer structure 18 implemented as a GaAs/$Al_{0.2}Ga_{0.8}As$ multiple quantum well (MQW) structure including three 7-nm-thick GaAs quantum well active layers, and an undoped upper $Al_{0.3}Ga_{0.7}As$ cladding layer 20 were consecutively grown on the p-type DBR 14.

Thereafter, 25 combinations of an n-type $Al_{0.2}Ga_{0.8}As$ layer and an $Al_{0.9}Ga_{0.1}As$ layer were grown on the upper cladding layer 20 to form an n-type DBR 22, followed by epitaxial growth of an n-type cap layer 24 on the top $Al_{0.2}Ga_{0.8}As$ layer of the n-type DBR 22, thereby obtaining the structure shown in FIG. 2A.

A SiNx film 26 was then deposited on the entire area by using a plasma enhanced CVD technique, followed by formation of a photoresist film 28 on the SiNx film 26 and patterning thereof by using an ordinary photolithographic technique to form an etching mask 28. The etching mask 28 had an annular opening which encircles a central circular pattern 30 having a diameter of 30 μm.

Figure 2B:
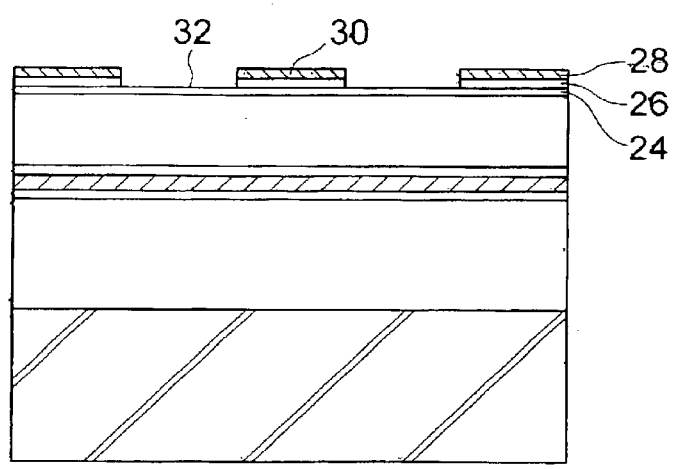
Figure 2C:
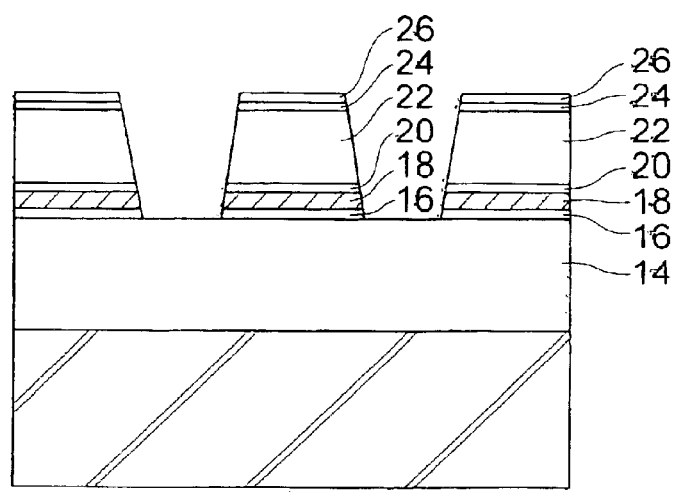

The SiNx film 26 was then subjected to a reactive ion etching (RIE) technique by using $CF_4$ gas and the etching mask 28 to form an opening 32 in the SiNx film 26. The resultant structure is shown in FIG. 2B.

The etching mask 28 was then removed, followed by wet etching of the n-type cap layer 24, n-type DBR 22, upper cladding layer 20, active layer structure 18 and lower cladding layer 16 by using the SiNx film 26 as an etching mask and an etchant including a mixture of phosphoric acid, hydrogen peroxide and water. Thus, an annular portion of the p-type DBR 14 was exposed, and a column structure including the n-type cap layer 24, n-type DBR 22, upper cladding layer 20, active layer structure 18 and lower cladding layer 16 was formed on the central area of the p-type DBR 14.

After removing the SiNx mask 26 by using a RIE technique, another SiNx film 34 was deposited on the entire area. Then, a portion of the top of the another SiNx film 34 covering the column structure was removed by using a photolithographic technique and a RIE technique to form an emission window 36 having a diameter of 10 μm. Subsequently, an n-side electrode 38 was formed by using an electron beam evaporation and a patterning technique to have an emission opening therein corresponding to the emission window 36. The n-side electrode 38 was made of a plurality of metallic films and had an annular area for current injection.

After the bottom of the GaAs substrate 12 was polished to obtain a thickness of 100 μm for the GaAs substrate 12, a p-side electrode 40 made of AuZn film was formed by evaporation onto the polished bottom surface of the GaAs substrate 12. A surface-emission semiconductor laser device 10 was thus achieved after an alloying treatment of the n-side electrode 38 and the p-side electrode 40.

Figure 2D:
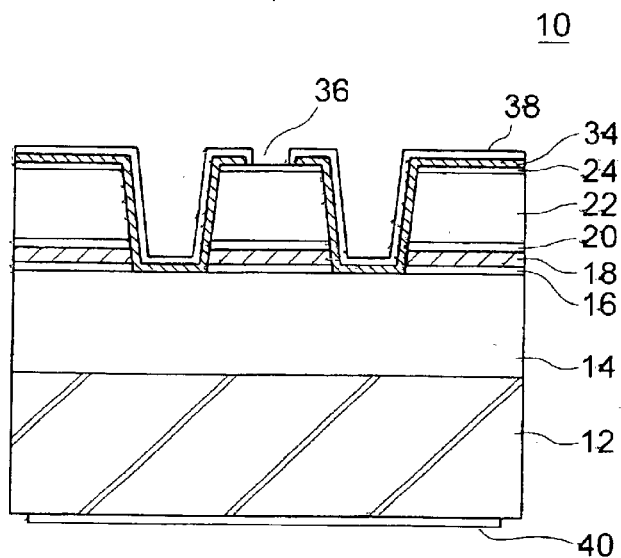

A plurality of samples for the surface-emission semiconductor laser device 10 of FIG. 2D were fabricated which included different structures of the n-side electrode. The samples had n-side electrodes including at least one of three films of metals or alloys, as shown in Table 1. In the table, each column shows the material for the corresponding film and the thickness (nm) thereof in parentheses.

TABLE 1

| Sample No. | First film | Second film | Third film |
| --- | --- | --- | --- |
| Sample #1 | Au (30) | AuGeNi (50) | Au (200) |
| Sample #2 | Au (30) | AuGe (50) | Au (200) |
| Sample #3 | Au (250) | | |
| Sample #4 | AuGeNi (50) | Au (200) | |
| Sample #5 | Ti (100) | Pt (200) | Au (200) |

The AuGeNi film in Samples #1 and. #4 included Ni at a ratio below 1%, Ge at about 12%, and the balance of Au at about 88%. The AuGe film in Sample #2 included Au at about 88% and the balance of Ge at about 12%.

The adherence between the metallic films and the compound semiconductor layer in each of Samples #1 to #5 was inspected at the surface of the n-side electrode after annealing the samples for three minutes at a temperature of 420° C. in a nitrogen ambient. Samples #1 to #3 exhibited an alloy structure of the n-side electrode, Samples #4 exhibited unevenness or irregularity at the surface of the n-side electrode, and Samples #5 did not exhibit an alloy structure, without a substantial change of the color or shape of the n-side electrode after the annealing.

More specifically, it is judged that Samples #1 and #2, wherein an Au film was interposed between the AuGeNi or Auge film and the compound semiconductor layer, had a higher adherence between the electrode and the semiconductor layer. It is also judged that Sample #2, wherein the electrode was formed by a single Au film, had a higher adherence. On the other hand, it is judged that Sample #4, wherein an Au film was formed on the AuGeNi film by evaporation, had poor adherence between the electrode and the compound semiconductor layer and that the anneal treatment caused agglomeration of metals in the electrode. It is also judged that Sample #5, wherein a Ti film was interposed, had a poor adherence because substantially no alloy was formed in the electrode.

From the above results for adherence, it is concluded that the Au film has an excellent adherence with respect to the compound semiconductor layer. It is also concluded that the Au film interposed between the AuGeNi or AuGe film and the compound semiconductor layer improves the adherence therebetween. That is, the excellent adherence between the Au film and the compound semiconductor layer improves the adherence between the electrode and the compound semiconductor layer even in the case of a small thickness of the Au film as low as 30 nm or below.

The next experiments were such that a voltage was applied between the p-side electrode and the n-side electrode in Samples #1 to #5 for measuring injected current vs. applied voltage characteristics. The results are shown in FIG. 3, wherein the applied voltage is plotted on abscissa and the injected current between the p-side electrode and the n-side electrode is plotted on ordinate.

Figure 3:
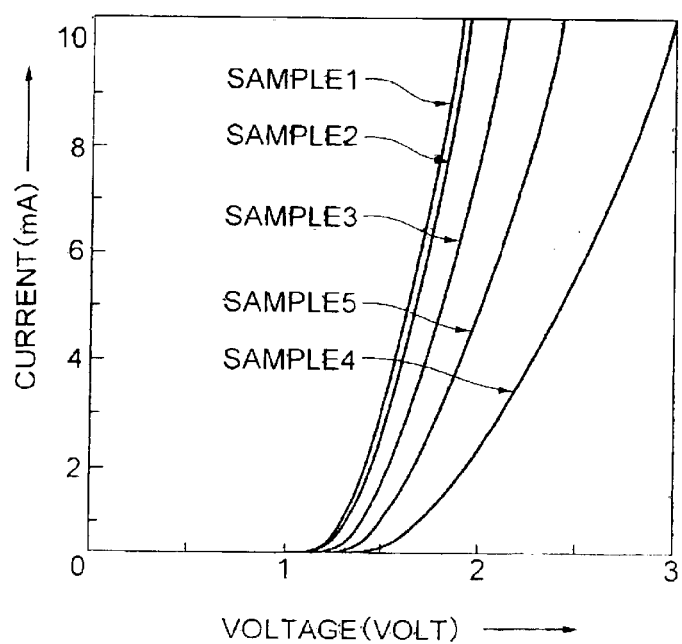
FIG. 3 is a graph for showing an injected current vs. applied voltage characteristic in the semiconductor laser device of the embodiment.

As understood from FIG. 3 by comparing the injected current among Samples #1 to #5, Samples #1 and #2 had larger current compared to Samples #3 to #5. This means that the electric resistance of the n-side electrode is smaller in Samples #1 and #2 having AuGe(Ni)/Au structure in the n-side electrode than in other samples.

Although Sample #3 had an excellent adherence between the n-side electrode and the compound semiconductor layer which is similar to the adherence in Samples #1 and #2, the alloy formed between the compound semiconductor and the metals in the electrode in Sample #3 had a higher electric resistivity compared to the alloy formed by the combination of AuGe(Ni)/Au in Samples #1 and #2.

Sample #4 had a highest resistance among the samples due to the fact that metals in the electrode in Sample #4 were agglomerated by the annealing treatment and an alloy was not substantially formed between the metals and the compound semiconductor layer.

It is known from the prior art that the metals of the electrode in Sample A5 do not form an alloy by an annealing treatment. For achieving a lower resistance electrode in the Ti/Pt/Au structure, it may be considered that the compound semiconductor layer is heavily doped with impurities. However, the improvement in the resistance by the heavy doping is limited compared to the improvement of resistance in the alloy.

From the above results, it is concluded that the Au film interposed between the AuGeNi or AuGe film and the compound semiconductor layer before an annealing treatment achieves a low-resistance electrode while suppressing agglomeration of metals in the electrode during the annealing treatment even in the case of a small thickness for the Au film.

Based on the findings as described above, the surface-emission semiconductor laser device of the present invention has an Au film interposed between the AuGeNi or AuGe film and the compound semiconductor layer.

Now, the present invention is more specifically described with reference to the preferred embodiment thereof.

The method of the preferred embodiment of the present invention is basically same as the method used for fabricating the samples as described above with reference to FIGS. 2A to 2D.

More specifically, in the method of the preferred embodiment of the present invention, 28 combinations of a p-type $Al_{0.2}Ga_{0.8}As$ layer and a p-type $Al_{0.9}Ga_{0.1}As$ layer and an additional p-type $Al_{0.9}Ga_{0.1}As$ layer are epitaxially grown on a p-type GaAs substrate 12 by using a MOCVD technique to form a p-type DBR 14, as shown in FIG. 2A.

Subsequently, an undoped lower $Al_{0.3}Ga_{0.7}As$ cladding layer 16, an active layer structure 18 implemented as a GaAs/$Al_{0.2}Ga_{0.8}As$ multiple quantum well (MQW) structure including three 7-nm-thick GaAs quantum well active layers, and an undoped upper $Al_{0.3}Ga_{0.7}As$ cladding layer 20 are consecutively grown on the p-type DBR 14.

Thereafter, 25 combinations of an n-type $Al_{0.2}Ga_{0.8}As$ layer and an $Al_{0.9}Ga_{0.1}As$ layer are grown on the upper cladding layer 20 to form an n-type DBR 22, followed by epitaxial growth of an n-type cap layer 24 on the top $Al_{0.2}Ga_{0.8}As$ layer of the n-type DBR 22, thereby obtaining the structure shown in FIG. 2A.

A SiNx film 26 is then deposited on the entire area by using a plasma enhanced CVD technique, followed by formation of a photoresist film 28 on the SiNx film 26 and patterning thereof by using an ordinary photolithographic technique to form an etching mask 28. The etching mask 28 has an annular opening which encircles a central circular pattern 30 having a diameter of 30 μm.

The SiNx film 26 is then subjected to a reactive ion etching (RIE) technique by using $CF_4$ gas and the etching mask 28 to form an opening 32 in the SiNx film 26. The resultant structure is shown in FIG. 2B.

The etching mask 28 is then removed, followed by wet etching of the n-type cap layer 24, n-type DBR 22, upper cladding layer 20, active layer structure 18 and lower cladding layer 16 by using the SiNx film as an etching mask and an etchant including a mixture of phosphoric acid, hydrogen peroxide and water. Thus, an annular portion of the p-type DBR 14 is exposed, and a column structure including the n-type cap layer 24, n-type DBR 22, upper cladding layer 20, active layer structure 18 and lower cladding layer 16 is formed on the central area of the p-type DBR 14.

After removing the SiNx film 26 by using a RIE technique, another SiNx film 34 is deposited on the entire area. Then, a portion of the top of the another SiNx film 34 covering the column structure is removed by using a photolithographic technique and a RIE technique to form an emission window 36 having a diameter of 10 μm. Subsequently, a 40-nm-thick Au film, a 50-nm-thick AuGeNi film and a 200-nm-thick Au film are consecutively deposited on the entire surface by electron beam evaporation, followed by patterning thereof to form a n-side electrode 38 having an emission window 36 and an annular area for current injection.

After the bottom of the GaAs substrate 12 is polished to obtain a thickness of 100 μm for the GaAs substrate 12, a p-side electrode 40 made of AuZn film is formed on the polished bottom surface of the GaAs substrate 12 by evaporation. A surface-emission semiconductor laser device 10 is achieved after an alloying treatment of the n-side electrode 38 and the p-side electrode 40.

In the above embodiment, the n-side electrode 38 and the p-side electrode 40 are subjected to the annealing treatment for three minutes at temperature of 420° C. in a nitrogen ambient for alloying the metals in the electrodes. The AuGeNi film in the n-side electrode 39 includes a small amount of Ni which is below 1%, Ge at about 12% and the balance of Au at about 88%.

The n-side electrode 38 may be formed of, for example, a 30-nm-thick Au film, a 50-nm-thick AuGe film and a 200-nm-thick Au film instead of the structure as described above. In this case, the AuGe film preferably includes Au at about 88% and Ge at about 12%.

Since the above embodiments are described only for examples, the present invention is not limited to the above embodiments and various modifications or alterations can be easily made therefrom by those skilled in the art without departing from the scope of the present invention. For example, an additional layer may be interposed between two of layers or at least one of layers may be omitted or modified in the laser device of the embodiment.

What is claimed is:

1. A method for fabricating a surface-emission semiconductor laser device comprising the steps of forming consecutively a p-type distributed Bragg reflector (DBR), an active layer structure for emitting laser, and an n-type DBR which overlie a main surface of a p-type semiconductor substrate, forming an n-side electrode overlying the n-type DBR, and forming a p-side electrode on a bottom surface of the p-type semiconductor substrate, the n-side electrode forming step including the consecutive steps of forming a substantially uniform Au film, followed by forming an AuGeNi film or AuGe film on the Au film, and lastly forming an alloy between the Au film and the AuGeNi film or AuGe film.

2. The method as defined in claim 1, wherein the alloy forming step includes annealing the Au film and the AuGeNi film or the AuGe film.

3. The method as defined in claim 1, wherein the n-side electrode forming step further includes another Au film on the AuGeNi film or the AuGe film.

4. The method as defined in claim 1, further comprising the steps of forming a p-type cladding layer between the active layer structure and the p-type DBR, and forming an n-type cladding layer between the n-type DBR and the active layer structure.

* * * * *